United States Patent
Dubin et al.

(10) Patent No.: US 7,525,196 B2
(45) Date of Patent: Apr. 28, 2009

(54) PROTECTION OF SEEDLAYER FOR ELECTROPLATING

(75) Inventors: Valery M. Dubin, Portland, OR (US); Peter K. Moon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 11/336,169

(22) Filed: Jan. 19, 2006

(65) Prior Publication Data
US 2006/0131750 A1 Jun. 22, 2006

Related U.S. Application Data

(62) Division of application No. 10/186,635, filed on Jun. 28, 2002, now Pat. No. 7,060,617.

(51) Int. Cl.
*H01L 23/48* (2006.01)
(52) U.S. Cl. .................. 257/751; 257/762; 257/774; 257/E23.145
(58) Field of Classification Search .............. 257/751, 257/762, 774
See application file for complete search history.

(56) References Cited

U.S. PATENT DOCUMENTS

| | | | |
|---|---|---|---|
| 4,420,385 A | 12/1983 | Hartsough | |
| 5,462,636 A | 10/1995 | Chen | |
| 5,773,198 A | 6/1998 | Swirbel | |
| 5,824,599 A | 10/1998 | Schacham-Diamond et al. | |
| 5,854,513 A | 12/1998 | Kim | |
| 6,140,027 A | 10/2000 | Baik et al. | |
| 6,140,234 A * | 10/2000 | Uzoh et al. | 438/678 |
| 6,171,730 B1 | 1/2001 | Kuroda | |
| 6,407,145 B1 | 6/2002 | Muller | |
| 6,503,693 B1 | 1/2003 | Mohondro | |

OTHER PUBLICATIONS

Junhwan Oh, "Plasma Pretreatment of the Cu Seed Layer Surface in Cu Electroplating", Materials Chemistry and Physics, 2002 Elsevier Science B.V.
J.P. Lu et al., "Understanding and Eliminating Defects in Electroplated Cu Films" 2001 IEEE International Interconnect Technology Conference, Jun. 2001, p. 280-282.

* cited by examiner

*Primary Examiner*—Thanh Nguyen
(74) *Attorney, Agent, or Firm*—George Chen

(57) ABSTRACT

The present invention includes a method of providing a substrate; sequentially forming a seed layer over the substrate and forming a protection layer over the seed layer; and sequentially removing the protection layer and forming a conductor over the seed layer.

The present invention further includes a structure having a substrate, the substrate having a device; an insulator disposed over the substrate, the insulator having an opening, the opening disposed over the device; a barrier layer disposed over the opening; a seed layer disposed over the barrier layer; and a protection layer disposed over the seed layer.

14 Claims, 2 Drawing Sheets

PROTECTION OF SEEDLAYER FOR ELECTROPLATING

This is a Divisional Application of Ser. No. 10/186,635, filed on Jun. 28, 2002, which was issued on Jun. 13, 2006 as U.S. Pat. No. 7,060,617.

BACKGROUND OF THE INVENTION

1. Field of the Invention

The present invention relates to the field of semiconductor integrated circuit (IC) manufacturing, and more specifically, to a method of protecting a seed layer for electroplating.

2. Discussion of Related Art

In 1965, Gordon Moore first observed that the number of transistors per unit area on a chip appeared to double approximately every 18 months. Ever since then, the semiconductor industry has managed to introduce new designs and processes on schedule to deliver the improvement in device density projected by the so-called Moore's Law. In particular, major enhancements in optics and photolithography have reduced the critical dimension (CD) that can be successfully patterned in the features on a chip or other substrate. At the same time, significant improvements in doping, deposition, and etch have decreased the concentration, depth, and thickness that can be precisely achieved across the substrate.

The transistors in a chip are formed in a semiconductor material on a substrate, such as a wafer. The transistors are then wired with multiple layers of interconnects. The interconnects are formed from an electrically conducting material and are isolated by an electrically insulating material. The electrically conducting material may be formed with an electroplating process and planarized with a chemical-mechanical polishing (CMP) process.

FIG. 1(a) shows a substrate 90 that includes a device 95. The substrate 90 is covered with an insulator 100. The insulator 100 is patterned and etched to produce an opening 105. A barrier layer 110 is formed over the opening 105 and the insulator 100. Then a seed layer 120 is formed over the barrier layer 110. An insulating defect 125 and a conducting defect 126 may appear on the seed layer 120.

FIG. 1(b) shows the results of electroplating a conductor 130 onto the surface of a seed layer 120 that already has the insulating defect 125 and the conducting defect 126. The insulating defect 125 will cause a void 127 to form nearby within the bulk of the conductor 130. The conducting defect 126 will cause a bump 128 to form at the electroplated upper surface 131 of the conductor 130.

FIG. 1(c) shows the results of planarizing the conductor 130 with a CMP process. The portion of the barrier layer 110 that is outside the original opening 105 may be removed by a CMP process or an etch process. The planarized upper surface 132 of the conductor 130 becomes flat and level with the planarized upper surface 102 of the insulator 100. An interconnect 135 becomes inset or inlaid within the original opening 105. The interconnect 135 may include a line 135B overlying a plug 135A.

A bump 128 at the surface of the conductor 130 that is small will usually be removed by planarization, but a bump 128 that is very large may affect the flatness of the planarized upper surface 132 of the interconnect 135.

A void 127 that is small and deep may remain embedded within the conductor 130, but a void 127 that is large and shallow may be opened up to form a surface defect 129, such as a depression, as shown in FIG. 1(c). A surface defect 129 may adversely affect the next layer of interconnect, depending on whether the surface defect 129 is subsequently filled with an insulator or a conductor.

After planarization, the original insulating defect 125 and the original conducting defect 126 may remain embedded within the conductor 130 if the defects 125, 126 are located within the original opening 105.

The defects 125, 126, and 127 may affect the resistance or capacitance of the interconnect 135, depending on whether the defects are electrically insulating or electrically conducting. Consequently, performance of the device 95 may be degraded. Furthermore, manufacturing yield, as well as device reliability, may also suffer.

Thus, what is needed is a method of protecting a seed layer for electroplating.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention includes a multilayer interconnect structure having a seed layer covered by a removable protection layer. The present invention further includes a method of protecting a seed layer for electroplating to prevent generation of defects. In one embodiment of the present invention, the generation of defects is prevented with two sets of sequential processes.

Sequential processes refer to back-to-back processes performed with one or more attributes, such as, in situ, after a short time has elapsed, without breaking vacuum, within a clean environment, within one chamber of a tool, and within different chambers of an integrated tool.

The first set of sequential processes includes forming the seed layer followed by covering the seed layer with a protection layer. The second set of sequential processes includes removing the protection layer from over the seed layer followed by covering the seed layer with an electrochemical process, such as electroplating.

Figure 1A:
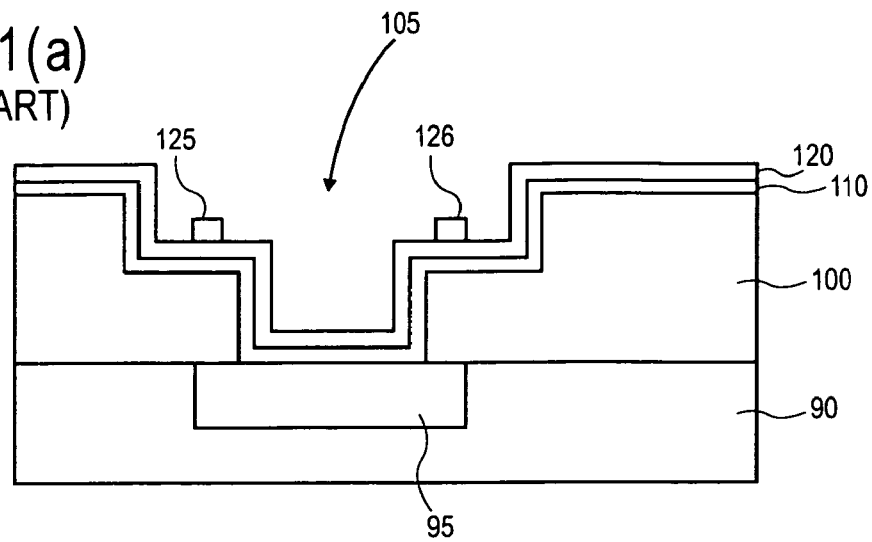
FIG. 1(a)-(c) are illustrations of a cross-sectional view of a method of forming a conductor by electroplating and planarizing according to the prior art.
Figure 1B:
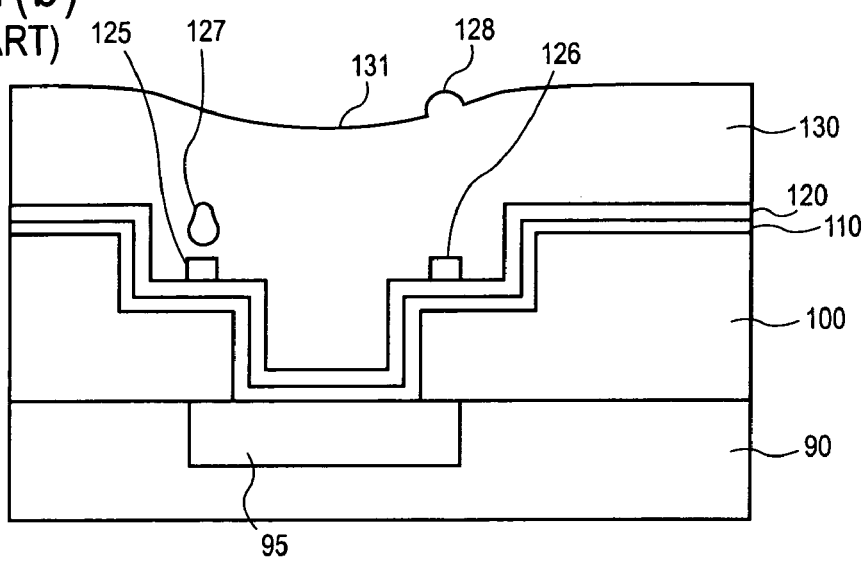
Figure 1C:
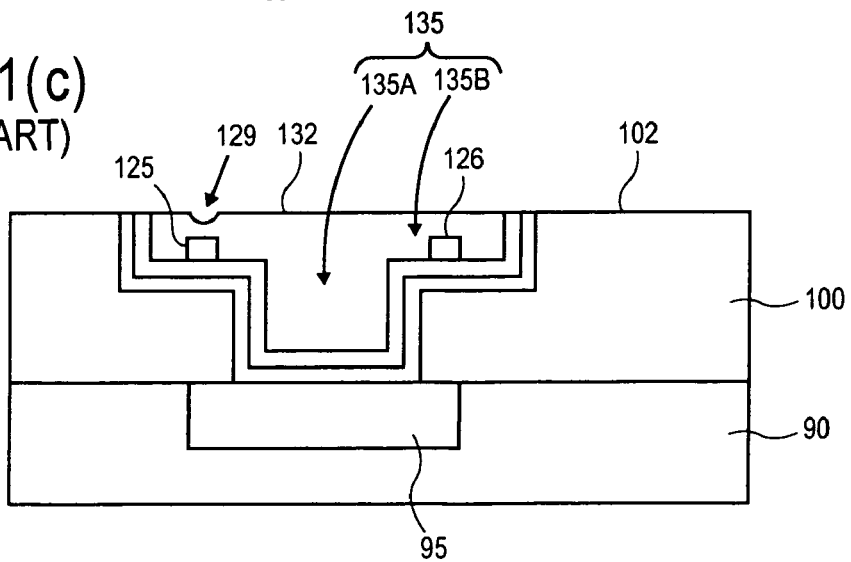
Figure 2A:
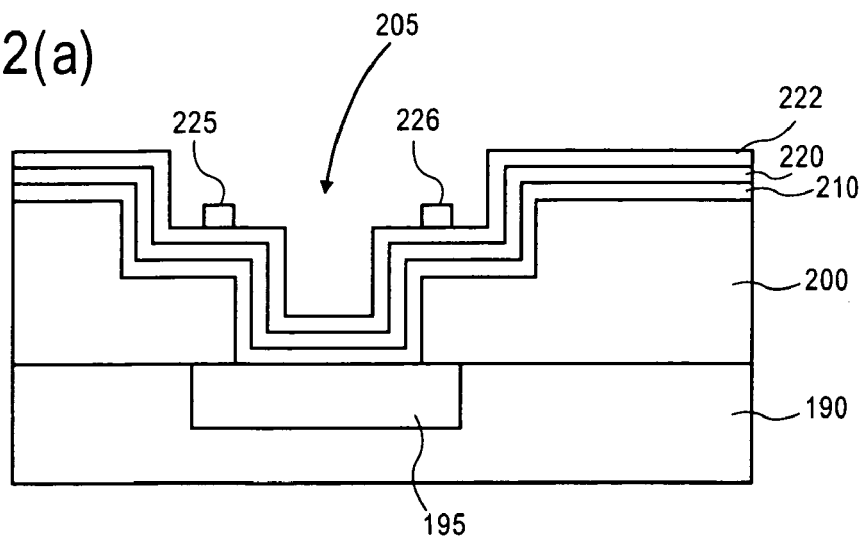
FIG. 2(a)-(c) are illustrations of a cross-sectional view of an embodiment of a method of protecting a seed layer for electroplating according to the present invention.
Figure 2B:
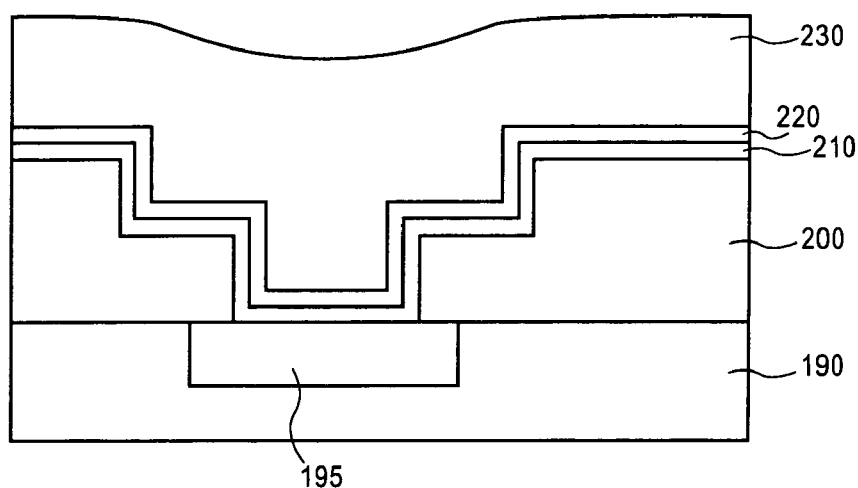
Figure 2C:
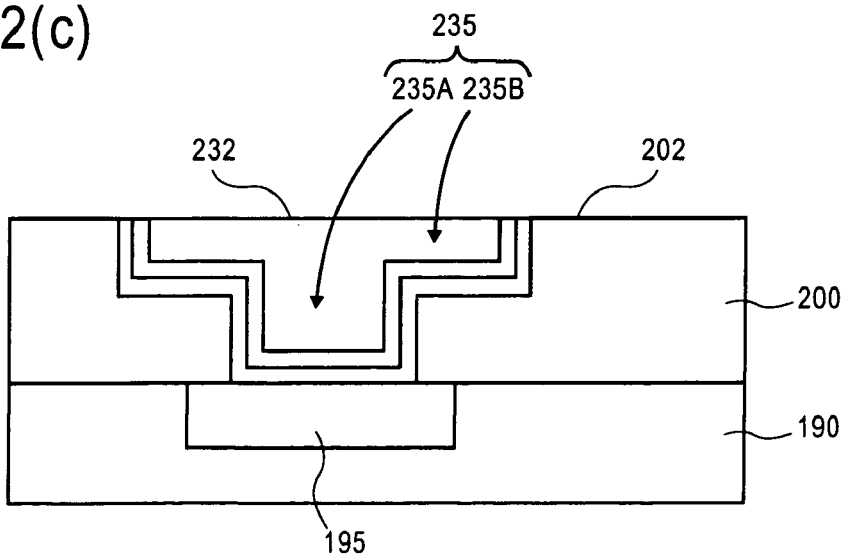

An embodiment of a method of protecting a seed layer for electroplating according to the present invention is shown in FIG. 2(a)-(c). As shown in an embodiment of the present invention in FIG. 2(a), a substrate 190 may include a device 195. The device 195 may be formed from a semiconductor material, such as Silicon, an electrically insulating material, such as Silicon Oxide or Silicon Nitride, and an electrically conducting material, such as Aluminum or Copper.

The substrate 190 may include a wafer having multiple chips, or a chip having multiple die, or a die having multiple devices. The substrate 190 is covered with an insulator 200. The insulator 200 is covered with photoresist that is patterned to form a mask. An etch is then done to form an opening 205. In a first embodiment, the opening 205 may be a via in a damascene process flow. In a second embodiment, the opening 205 may be a trench in a damascene process flow. A hard mask may be used for the etch if selectivity of the insulator 200 to photoresist is low.

In a third embodiment, the opening 205 may be a trench overlying a via in a dual damascene process flow. A dual damascene process flow requires patterning, etching, patterning again, and etching again. Either the via may be defined first or the trench may be defined first. The via etch may stop on an etch stop layer. The trench etch may stop on an etch stop layer or may be a timed etch.

Next, a barrier layer 210 is formed over the opening 205 and the insulator 200. Copper has a high diffusivity so, if the conductor 230 will include Copper, the barrier layer 210 is necessary to prevent diffusion of the Copper into the insulator 200 and the device 195 in the substrate 190. Otherwise, Copper may introduce mid-gap states into the semiconductor material, such as Silicon, and degrade carrier lifetime.

The barrier layer 210 may have a thickness selected from the range of about 1.0-100.0 nanometers (nm). In order to serve as a liner, or encapsulant, for the conductor 230, the barrier layer 210 should have good adhesion to the underlying insulator 200, the underlying substrate 190, and the overlying seed layer 220. However, the barrier layer 210 should also have minimal interaction, such as chemical or electrochemical reaction, with the underlying insulator 200, the underlying substrate 190, and the overlying seed layer 220.

The barrier layer 210 may be formed from a metal, including a refractive metal, such as Tantalum (Ta), Cobalt (Co), and Ruthenium (Ru), or an alloy, such as Titanium-Tungsten (TiW). The barrier layer 210 may also be formed from a ceramic, such as Tantalum-Nitride (TaN), Tantalum-Silicon-Nitride (TaSiN), Titanium-Nitride (TiN), Titanium-Silicon-Nitride (TiSiN), Tungsten-Nitride (WN), and Tungsten-Silicon-Nitride (WSiN).

In one embodiment, the barrier layer 210 may include a lower layer of TaN to adhere to the underlying insulator 200 and the underlying substrate 190, as well as an upper layer of Ta to adhere to the overlying seed layer 220. Such a bilayer may have a total thickness of about 15.0-35.0 nm.

Ionized physical vapor deposition (I-PVD) may be used to form the barrier layer 210 since I-PVD has high directionality and can produce better step coverage than other techniques, such as collimation sputtering or long-throw sputtering (LTS). In certain cases, a metal-organic CVD (MOCVD) process may be used to form the barrier layer 200. Alternatively, the barrier layer 200 may be formed using atomic layer deposition (ALD) when a thickness of about 10.0 nm or less is desired. ALD can provide good step coverage and good uniformity even while permitting the use of a low deposition temperature of about 200-400 degrees Centigrade.

Next, a seed layer 220 is formed over the barrier layer 210. In order to serve as a base for electroplating the conductor 230, the seed layer 220 must be electrically conductive and continuous over the barrier layer 210. The seed layer 220 typically has a thickness selected from a range of about 2.0-250.0 nm. Adhesion loss of the seed layer 220 or interfacial reaction of the seed layer 220 with the barrier layer 210 should be prevented.

The seed layer 220 may be formed from the same material as the conductor 230, such as Copper. Alternatively, the seed layer 220 may be formed from a different material from the conductor 230, including another metal or an alloy, such as Copper-Tin (CuSn), Copper-Indium (CuIn), Copper-Bismuth (CuBi), Copper Carbide (CuC), Copper-Aluminum (CuAl), and Copper-Silver (CuAg).

The seed layer 220 may be deposited by I-PVD in a standalone tool. Alternatively, the barrier layer 210 and the seed layer 220 may be sequentially deposited under vacuum in one tool.

In some cases, better material properties and surface characteristics may be achieved for the conductor 230 if the seed layer 220 is formed using CVD. The seed layer 220 may also be formed with ALD or electroless plating.

Next, a protection layer 222 is formed over the seed layer 220. As shown in FIG. 2(a), a protection layer 222 is formed over the seed layer 220 and left in place, such as during storage, until a time when the conductor 230 will be formed, such as by electroplating. The protection layer 222 may be deposited from a vapor phase or a liquid phase, using a standalone tool or a tool integrated with another process tool.

In one embodiment, the protection layer 222 has a thickness selected from a range of about 5.0-500.0 nm. In a second embodiment, the protection layer 222 is a single molecular layer. In a third embodiment, the protection layer 222 is a single atomic layer. In a fourth embodiment, the protection layer 222 is a monolayer.

In one embodiment, the protection layer 222 may be a polymer. The protection layer 222 may be a polymer with a molecular weight of about 100 or greater. The protection layer 222 may be a polymer with functional groups that attach to the seed layer 220 through adsorption, such as chemisorption or physisorption or a combination of multiple mechanisms. Such functional groups may include Nitrogen, such as an amine group, and Sulfur.

In one embodiment, the protection layer 222 may be a water-soluble material and removable with an aqueous solution. The aqueous solution may be acidic, such as an electroplating bath.

In still another embodiment, the protection layer 222 may be a water soluble polymer, such as polyvinyl alcohol, polyoxyethylene, polyethylene glycol, polypropylene glycol, polyimide, polysulfide, imidoazole, and polyamine.

In another embodiment, the protection layer 222 may be soluble in a solvent, such as isopropyl alcohol (IPA), and thus removable by that solvent.

In another embodiment, the protection layer 222 may be removable by exposure to heat. Raising the temperature by heating may induce a physical change, such as a phase change, including evaporation, especially, if the protection layer 222 is volatile. Heating may also induce a chemical change, such as chemical breakdown or thermolysis.

In another embodiment, the protection layer 222 may be removable by exposure to radiation, such as ultraviolet light. Exposure to light may induce a chemical change, such as photolysis. Exposure to light may also raise the temperature by heating.

Next, after removal of the protection layer 222, the conductor 230 is formed over the seed layer 220. The conductor 223 and the seed layer 220 may be formed from the same material or from different materials. Adhesion loss of the conductor 230 or interfacial reaction of the conductor 230 with the seed layer 220 should be prevented. The conductor 230 may include a metal, such as Copper, or an alloy. In one embodiment, the conductor 230 has a thickness of about 0.2-2.8 microns (um).

The conductor 230 may be formed by an electrochemical process, such as electroplating or electrofilling. Electroplating of the conductor 230 may be performed in a bath or a solution containing ions of the material to be deposited. The seed layer 220 acts as a negative electrode of an electrochemical cell. Electroplating may be carried out in the solution using a constant current, a constant voltage, or variable waveforms of current or voltage, depending on the thickness and the film properties that are desired. When current is turned on, positive ions in the electroplating solution combine with electrons produced at a surface of the seed layer 220. The ions are chemically reduced to atoms which form the conductor 230 over the seed layer 220.

Successful electroplating of the conductor 230 may require the use of various additives that are surface active. The additives to the electroplating solution are usually organic and may include functional groups of Sulfur or Nitrogen. The proper balance of inhibitors (suppressors) and accelerators in the electroplating solution may be required to prevent defects. Good thickness uniformity from substrate-to-substrate and smooth surface finish of the conductor 230 may also require the use of levelers and brighteners in the electroplating solution.

The concentrations of various ions, such as Copper, Chloride, and Hydrogen, in the electroplating solution may be adjusted in response to the monitoring of parameters, such as pH, conductivity, and the absorbance in the visible portion of the electromagnetic spectrum. Cyclic Voltammetric Stripping (CVS) analysis may be used to measure the concentration of the additives in the electroplating solution.

During or after formation of the conductor 230, a treatment may be used to modify material properties or surface characteristics of the conductor 230. The treatment of the conductor 230 may include a rapid thermal anneal (RTA) process after deposition to modify or stabilize the grain size of the conductor 230. Copper that has been formed by electroplating may have a grain size of about 0.05-10.00 um, depending on the thickness, deposition conditions, and anneal conditions. A larger grain size in the conductor 230 usually corresponds to a lower resistivity. For example, Copper may have a resistivity of about 1.0-4.0 micro-ohm-centimeter.

In one embodiment of the present invention, the generation of defects is prevented with two sets of sequential processes. Sequential processes refer to back-to-back processes performed with one or more attributes, such as, in situ, after a short time has elapsed, without breaking vacuum, within a clean environment, within one chamber of a tool, and within different chambers of an integrated tool. In one embodiment, a short time includes passage of 60 seconds or less.

As shown in an embodiment of the present invention in FIG. 2(a), the first set of sequential processes includes forming a seed layer 220 over the barrier layer 210, sequentially followed by forming a protection layer 222 over the seed layer 220.

As shown in an embodiment of the present invention in FIG. 2(b), the second set of sequential processes includes removing the protection layer 222 from over the seed layer 220 followed by covering the seed layer 220 with a conductor 230. The conductor 230 may be formed by electroplating.

In one embodiment, the protection layer 222 prevents formation of the insulating defect 225 and the conducting defect 226 over the seed layer 220. Consequently, after removal of the protection layer 222, electroplating will form the conductor 230 over the seed layer 220 without generating any defects 225, 226. Thus, the conductor 230 will have no void or bump after planarization.

In another embodiment, before electroplating is performed, the insulating defect 225 and the conducting defect 226 may form over the protection layer 222, but the protection layer 222 prevents contact between the defects 225, 226 and the seed layer 220. Consequently, removal of the protection layer 222 will also remove the defects 225, 226 over the protection layer 222 by a physical mechanism, such as lift-off, or by a chemical mechanism, such as dissolution, or by a combination of mechanisms. Thus, the conductor 230 will also have no void or bump after planarization.

The defects 225, 226 may result from chemical reaction in the presence of air or moisture. An example is an Oxide or Sulfide film. In one embodiment, environmental contamination by an inorganic material may form the insulating defect 225 or the conducting defect 226. An example is a particle or flake of Oxide or metal in the air that settles out by gravitational forces or is attracted by electrostatic forces. In another embodiment, the defects 225, 226 may result from environmental contamination by organic molecules, such as Octyl isothiazolone and Methylene diphenyl di-isocyanate.

Next, as shown in an embodiment of the present invention in FIG. 2(c), a CMP process may be used to planarize the conductor 130. The portion of the barrier layer 210 that is outside the original opening 205 may be removed by a CMP process or an etch process. The upper surface 232 of the conductor 230 becomes flat and level with the upper surface 202 of the insulator 200. An interconnect 235 becomes inset or inlaid within the original opening 205. The interconnect 235 may include a line 235B overlying a plug 235A. Further processing may be performed depending on the number of layers of interconnects that is needed.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of protecting a seed layer for electroplating.

We claim:

1. An intermediate structure before an electrochemical process comprising:
   a substrate, said substrate comprising a device;
   an insulator disposed over said substrate;
   an opening disposed in said insulator, said opening disposed over said device;
   a barrier layer disposed over said insulator and said opening;
   a seed layer disposed over said barrier layer;
   a protection layer disposed over said seed layer; and
   a defect disposed over said protection layer, wherein said protection layer prevents contact between said defect and said seed layer.

2. The structure of claim 1 wherein said protection layer comprises a single molecular layer.

3. The structure of claim 1 wherein said protection layer comprises a monolayer.

4. The structure of claim 1 wherein said protection layer comprises an Amine functional group that attaches to said seed layer.

5. The structure of claim 1 wherein said protection layer comprises a polymer with a molecular weight of about 100 or greater.

6. The structure of claim 5 wherein said polymer comprises an alcohol or a glycol that is soluble in water.

7. The structure of claim 1 wherein said protection layer is soluble in a solvent.

8. The structure of claim 1 wherein said protection layer is removable by exposure to heat.

9. The structure of claim 1 wherein said protection layer is removable by exposure to radiation.

10. The structure of claim 1 wherein said defect comprises an insulating defect.

11. The structure of claim 1 wherein said defect comprises a conducting defect.

12. The structure of claim 1 wherein said opening comprises a trench overlying a via.

13. The structure of claim 1 wherein said barrier layer comprises a bilayer.

14. The structure of claim 1 wherein said seed layer is electrically conductive and continuous over said barrier layer.

* * * * *